United States Patent [19]

Takeshita et al.

[11] Patent Number: 4,929,597

[45] Date of Patent: May 29, 1990

[54] SUPERCONDUCTOR CONTAINING INTERNAL STRESS ABSORBER

[75] Inventors: Takuo Takeshita; Tadashi Sugihara; Shuichi Fujino, all of Saitama, Japan

[73] Assignee: Mitsubishi Metal Corporation, Tokyo, Japan

[21] Appl. No.: 328,653

[22] Filed: Mar. 27, 1989

[30] Foreign Application Priority Data

Mar. 25, 1988 [JP] Japan .................................. 63-71633

[51] Int. Cl.$^5$ ................................................. B32B 9/00
[52] U.S. Cl. ........................................ 505/1; 505/701; 505/702; 505/703; 505/704; 29/599; 428/209; 428/432; 428/688; 428/693; 428/697; 428/901; 428/930

[58] Field of Search ........................... 505/1, 701–704, 505/724; 29/599; 428/209, 432, 688, 693, 697, 901, 930

[56] References Cited

PUBLICATIONS

Japanese Journal Appl. Phys., vol. 27, No. 3, 3/88, 6384–6386.

*Primary Examiner*—Patrick Ryan
*Attorney, Agent, or Firm*—Sughrue, Mion, Zinn, Macpeak & Seas

[57] ABSTRACT

A superconductor according to the present invention contains an internal stress absorbing substance of a copper oxide and/or a barium oxide distributed over the superconductive oxide, so that the superconductor is free from cracks due to thermal stresses produced in a heat treatment.

8 Claims, No Drawings

SUPERCONDUCTOR CONTAINING INTERNAL STRESS ABSORBER

FIELD OF THE INVENTION

This invention relates to a superconductor and, more particularly, to the structure of a superconductor which is less liable to have internal stresses after a heat treatment.

BACKGROUND OF THE INVENTION

Various formation processes such as sputtering techniques or physical evaporation techniques are used for forming superconductive strips on substrates. However, the deposited superconductive material is usually covered with a certain surface film which tends to suppress the superconductivity. The superconductive strip is then subjected to a heat treatment in an oxidation ambient between about 800 degrees and about 950 degrees in centigrade for about an hour, and the heat treatment aims at refining the undesirable surface film.

However, a problem is encountered in the prior art refining technique in that cracks tend to take place in the superconductive strips due to thermal stress. This is because of the fact that the superconductive strips are usually different in thermal expansion coefficient from the substrate. The cracks deteriorate the production yield of the superconductive strips.

SUMMARY OF THE INVENTION

It is therefore an important object of the present invention to provide a superconductive material which withstands the internal stress produced in the heat treatment for refining the surface film.

It is another important object of the present invention to provide a superconductive material which is elastic enough to absorb the thermal stress.

To accomplish these objects, the present invention proposes to distribute a copper oxide or a barium oxide over the superconductive material for absorbing the thermal stress.

In accordance with the present invention, there is provided a superconductor containing a superconductive oxide and an internal stress absorbing substance distributed over the superconductive oxide.

The internal stress absorbing substance may range from about 0.12% by volume to about 7.9% by volume. In one implementation, the internal stress absorbing substance is selected from the group consisting of a copper oxide and a barium oxide, however, both of the copper oxide and the barium oxide constitute the internal stress absorbing substance in another implementation.

DESCRIPTION OF THE PREFERRED EMBODIMENTS

Description is made for a process of forming superconductive strips on substrates.

The process starts with preparation of powders of various superconductive oxides, a powder of a copper oxide, and a powder of a barium oxide. Each of the superconductive oxides is represented by the molecular formula shown in Table 1, and the powder of each superconductive oxide has an average diameter of about 5 microns. The copper oxide and the barium oxide serve as internal stress absorbing substance, and, for this reason, each of these powders is hereinunder referred to as "absorbing powder".

The powder of each superconductive oxide and each or both of the absorbing powders are mixed in a proportion indicated in Table 1 to produced a mixed powder. Each mixed powder is shaped into a disk configuration, and, then, sintered in a high temperature atmospheric ambient for about 3 hours to produce a target. The high temperature atmospheric temperature ranges from about 850 degrees to about 1000 degrees in centigrade, and the target is about 100 millimeters in diameter and about 5 millimeters in thickness. In this manner, a plurality of targets are produced and different in composition from one another. The targets are substantially identical in composition with the mixed powders, respectively, and have respective structures each having grains of the copper oxide and/or grains of the barium oxide distributed over the superconductive oxide.

Each of the targets thus produced is installed in a high-frequency sputtering system and faced to a substrate of a single crystal magnesium oxide with <100> orientation. The substrate is spaced apart from the target by about 90 millimeters and has a square surface of about 10 millimeters×about 10 millimeters The sputtering chamber is filled with a gaseous mixture with the argon/oxygen ratio of about 3:1, and the gaseous mixture is adjusted to about $5 \times 10^{-3}$ torr. The substrate is heated to about 650 degrees in centigrade, and the sputtering is carried out at about 200 watts for about 8 hours. A plurality of superconductive strips are thus deposited to a thickness of about 2 microns on the substrates, respectively, and, then, subjected to a heat treatment in an oxygen ambient at about 910 degrees in centigrade for about an hour. The compositions of the superconductive strips are indicated in Table 1 with reference numerals 1 to 9 and have the grains of the copper oxide and/or the grains of the barium oxide distributed over the superconductive oxides, respectively.

For comparison use, prior-art superconductive strips 10 to 14 are produced and also indicated in Table 1. The prior-art superconductive strips are formed of respective superconductive oxides without any grains of the copper oxide or the grains of the barium oxide. All of the superconductive strips 1 to 14 are observed whether or not cracks are produced therein, and critical current densities as well as critical temperatures are respectively measured. The results are indicated in Table 2.

TABLE 1

| Speci-men | Composition of Target (% by volume) | | | Composition of Strip (% by volume) | | |
|---|---|---|---|---|---|---|
| | S.C. Oxide | CuO | BaO | S.C. Oxide | CuO | BaO |
| 1 | $YBa_2Cu_3O_{6.9}$(residual) | 0.15 | — | $YBa_2Cu_3O_{6.9}$(residual) | 0.12 | — |
| 2 | $YBa_2Cu_3O_{6.9}$(residual) | — | 3 | $YBa_2Cu_3O_{6.9}$(residual) | — | 2.2 |
| 3 | $YBa_2Cu_3O_{6.9}$(residual) | 5 | — | $YBa_2Cu_3O_{6.9}$(residual) | 4.3 | — |
| 4 | $YBa_2Cu_3O_{6.9}$(residual) | 4 | 4 | $YBa_2Cu_3O_{6.9}$(residual) | 3.0 | 3.1 |
| 5 | $YBa_2Cu_3O_{6.9}$(residual) | — | 10 | $YBa_2Cu_3O_{6.9}$(residual) | — | 7.9 |

TABLE 1-continued

| Speci-men | Composition of Target (% by volume) | | | Composition of Strip (% by volume) | | |
|---|---|---|---|---|---|---|
| | S.C. Oxide | CuO | BaO | S.C. Oxide | CuO | BaO |
| 6 | $Sc_{0.1}Gd_{0.9}Ba_2Cu_3O_{6.9}$ (residual) | 2 | 2 | $Sc_{0.1}Gd_{0.9}Ba_2Cu_3O_{6.9}$ (residual) | 1.6 | 1.5 |
| 7 | $SmBa_2Cu_3O_{6.9}$ (residual) | 2.5 | 2.5 | $SmBa_2Cu_3O_{6.9}$ (residual) | 2.0 | 2.1 |
| 8 | $EuBa_2Cu_3O_{6.9}$ (residual) | 10 | — | $EuBa_2Cu_3O_{6.9}$ (residual) | 7.8 | — |
| 9 | $Yb_{0.5}Nd_{0.5}Ba_2Cu_3O_{6.9}$ (residual) | — | 0.5 | $Yb_{0.5}Nd_{0.5}Ba_2Cu_3O_{6.9}$ (residual) | | |
| 10 | $YBa_2Cu_3O_{6.9}$ 100 | — | — | $YBa_2Cu_3O_{6.9}$ 100 | — | — |
| 11 | $Sc_{0.1}Gd_{0.9}Ba_2Cu_3O_{6.9}$ 100 | — | — | $Sc_{0.1}Gd_{0.9}Ba_2Cu_3O_{6.9}$ 100 | — | — |
| 12 | $SmBa_2Cu_3O_{6.9}$ 100 | — | — | $SmBa_2Cu_3O_{6.9}$ 100 | — | — |
| 13 | $EuBa_2Cu_3O_{6.9}$ 100 | — | — | $EuBa_2Cu_3O_{6.9}$ 100 | — | — |
| 14 | $Yb_{0.5}Nd_{0.5}Ba_2Cu_3O_{6.9}$ 100 | — | — | $Yb_{0.5}Nd_{0.5}Ba_2Cu_3O_{6.9}$ 100 | — | — |

In Table 1, S.C. stands for the word "superconductive", and CuO and BaO represent the copper oxide and the barium oxide, respectively.

TABLE 2

| Speci-men | Cracks | Critical current density (A/cm²) | Critical Temperature (degrees in Kelvin) |
|---|---|---|---|
| 1 | none | $6.0 \times 10^4$ | 76 |
| 2 | none | $2.2 \times 10^4$ | 75 |
| 3 | none | $8.5 \times 10^4$ | 78 |
| 4 | none | $5.5 \times 10^4$ | 75 |
| 5 | none | $1.3 \times 10^4$ | 74 |
| 6 | none | $6.0 \times 10^4$ | 76 |
| 7 | none | $7.2 \times 10^4$ | 75 |
| 8 | none | $9.0 \times 10^4$ | 78 |
| 9 | none | $1.8 \times 10^4$ | 76 |
| 10 | Observed | $7.2 \times 10^3$ | 77 |
| 11 | Observed | $5.8 \times 10^3$ | 77 |
| 12 | Observed | $9.2 \times 10^3$ | 74 |
| 13 | Observed | $9.5 \times 10^3$ | 76 |
| 14 | Observed | $6.3 \times 10^3$ | 77 |

As will be understood from Table 2, the grains of the copper oxide and/or the grains of the barium oxide effectively absorb the thermal stress produced in the heat treatment stage. The stress absorber content of the superconductive strip is fallen within the range between about 0.12% by volume and about 7.9% by volume. If the stress absorber content is less than 0.1% by volume, the cracks are hardly suppressed due to insufficient absorption. On the other hand, if the stress absorber content exceeds about 8.0% by volume, the strip tends to deteriorate in superconductivity.

Although particular embodiments of the present invention have been shown and described, it will be obvious to those skilled in the art that various changes and modifications may be made without departing from the spirit and scope of the present invention.

We claim:

1. A superconductor containing a superconductive oxide and an internal stress absorbing substance distributed over the superconductive oxide, in which said internal stress absorbing substance ranges from about 0.12% by volume to about 7.9% by volume, and in which said internal stress absorbing substance is selected from the group consisting of a copper oxide and a barium oxide.

2. A superconductor as set forth in claim 1, in which said superconductive oxide is represented by the molecular formula of $YBa_2Cu_3O_{6.9}$.

3. A superconductor as set forth in claim 1, in which said superconductive oxide is represented by the molecular formula of $EuBa_2Cu_3O_{6.9}$.

4. A superconductor as set forth in claim 1, in which said superconductive oxide is represented by the molecular formula of $Yb_{0.5}Nd_{0.5}Ba_2Cu_3O_{6.9}$.

5. A superconductor as set forth in claim 1, in which said internal stress absorbing substance is partially formed of a copper oxide and partially formed of a barium oxide.

6. A superconductor as set forth in claim 5, in which said superconductive oxide is represented by the molecular formula of $YBa_2Cu_3O_{6.9}$.

7. A superconductor as set forth in claim 5, in which said superconductive oxide is represented by the molecular formula of $Sc_{0.1}Gd_{0.9}Ba_2Cu_3O_{6.9}$.

8. A superconductor as set forth in claim 5, in which said superconductive oxide is represented by the molecular formula of $SmBa_2Cu_3O_{6.9}$.

* * * * *

UNITED STATES PATENT AND TRADEMARK OFFICE
CERTIFICATE OF CORRECTION

PATENT NO. :  4,929,597

DATED     :  May 29, 1990

INVENTOR(S) :  Takeshita et al.

It is certified that error appears in the above-identified patent and that said Letters Patent is hereby corrected as shown below:

Col. 3, Table 1, Specimen #9, under second column labeled "BaO" insert --0.4--.

Signed and Sealed this

Twentieth Day of August, 1991

Attest:

HARRY F. MANBECK, JR.

Attesting Officer

Commissioner of Patents and Trademarks